United States Patent
Pedersen et al.

(10) Patent No.: US 11,970,765 B2
(45) Date of Patent: Apr. 30, 2024

(54) METHOD AND APPARATUS FOR CHEMICAL VAPOUR DEPOSITION

(71) Applicant: Ionautics AB, Öjebyn (SE)

(72) Inventors: Henrik Pedersen, Stigtomta (SE); Hama Nadhom, Linköping (SE)

(73) Assignee: Ionautics AB, Öjebyn (SE)

( * ) Notice: Subject to any disclaimer, the term of this patent is extended or adjusted under 35 U.S.C. 154(b) by 175 days.

(21) Appl. No.: 17/426,714

(22) PCT Filed: Jan. 15, 2020

(86) PCT No.: PCT/SE2020/050036
§ 371 (c)(1),
(2) Date: Jul. 29, 2021

(87) PCT Pub. No.: WO2020/159418
PCT Pub. Date: Aug. 6, 2020

(65) Prior Publication Data
US 2022/0098725 A1  Mar. 31, 2022

(30) Foreign Application Priority Data
Feb. 1, 2019  (SE) .................... 1950124-6

(51) Int. Cl.
*C23C 16/44* (2006.01)
*C23C 16/02* (2006.01)
(Continued)

(52) U.S. Cl.
CPC ...... *C23C 16/0272* (2013.01); *C23C 16/0227* (2013.01); *C23C 16/042* (2013.01);
(Continued)

(58) Field of Classification Search
CPC ............. C23C 18/145; C23C 16/45525; H01J 2237/3321; H01J 37/32422;
(Continued)

(56) References Cited

U.S. PATENT DOCUMENTS 3,885,076 A    5/1975  Heidenreich et al.
6,582,777 B1   6/2003  Ross et al.
(Continued)

FOREIGN PATENT DOCUMENTS

JP    2006526885 A    11/2006
JP    2017520123 A    7/2017
(Continued)

OTHER PUBLICATIONS

International Search Report and Written Opinion for International Application No. PCT/SE2020/050036, dated Jan. 4, 2020, (12 pages).
(Continued)

*Primary Examiner* — Jaehwan Oh
(74) *Attorney, Agent, or Firm* — Kagan Binder, PLLC

(57) ABSTRACT

The present disclosure relates to a method for chemical vapour deposition on a substrate, the method comprising a precursor step and a reactant step, wherein the precursor step comprises chemisorbing a layer of precursor molecules on the substrate (170), and wherein the reactant step comprises adding to at least part of the substrate (170) surface species able to reduce the precursor molecule, whereby at least a part of the reduced precursor molecule is deposited on the substrate (170) surface, characterized by applying by means of a voltage source (130) a positive bias to at least part of the substrate (170) surface during at least part of the reactant step, wherein the step of adding the reducing species comprises providing by means of an electron source (150) electrons as free particles, whereby during the reactant step a closed electrical circuit is formed as the free electrons are transmitted to the substrate (170) surface.

11 Claims, 2 Drawing Sheets

(51) Int. Cl.
 *C23C 16/04* (2006.01)
 *C23C 16/455* (2006.01)
 *C23C 16/48* (2006.01)
 *C23C 18/14* (2006.01)
 *H01J 37/32* (2006.01)
 *H01L 21/285* (2006.01)

(52) U.S. Cl.
 CPC ...... *C23C 16/45523* (2013.01); *C23C 16/487* (2013.01); *C23C 18/145* (2019.05); *H01J 37/32422* (2013.01); *H01L 21/28506* (2013.01); *H01J 2237/3321* (2013.01)

(58) Field of Classification Search
 CPC ........... H01L 21/28556; H01L 21/0228; H01L 21/31604; H01L 21/0262
 See application file for complete search history.

(56) References Cited

U.S. PATENT DOCUMENTS

| | | | | |
|---|---|---|---|---|
| 8,425,987 | B2* | 4/2013 | Dominguez | C23C 16/487 |
| | | | | 427/585 |
| 2005/0284360 | A1 | 12/2005 | Rueger | |
| 2006/0042752 | A1* | 3/2006 | Rueger | H01L 21/02274 |
| | | | | 156/345.1 |
| 2006/0269688 | A1 | 11/2006 | Sadewasser et al. | |
| 2008/0188062 | A1* | 8/2008 | Chen | H01L 21/02529 |
| | | | | 438/483 |
| 2010/0166981 | A1* | 7/2010 | Dominguez | C23C 16/18 |
| | | | | 427/576 |
| 2016/0326646 | A1 | 11/2016 | Matsumoto et al. | |
| 2019/0221433 | A1* | 7/2019 | Raisanen | C23C 16/45525 |

FOREIGN PATENT DOCUMENTS

| | | |
|---|---|---|
| WO | 0161737 A1 | 8/2001 |
| WO | 2013191065 A1 | 12/2013 |
| WO | 2015199862 A1 | 12/2015 |

OTHER PUBLICATIONS

First Chinese Office Action, and English Translation thereof, for Chinese Application No. 202080010857.5, dated Nov. 3, 2023, (14 pages).

Extended European Search Report for European Application No. 20747560.9, dated Sep. 27, 2022, (6 pages).

First Japanese Office Action, and English translation thereof, for Japanese Counterpart Application No. 2021-544851, mailed Jan. 30, 2024. (8 pages).

* cited by examiner

METHOD AND APPARATUS FOR CHEMICAL VAPOUR DEPOSITION

CROSS-REFERENCE TO RELATED APPLICATIONS

This application claims priority to International Application No. PCT/SE2020/050036, filed Jan. 15, 2020 and titled "A METHOD AND APPARATUS FOR CHEMICAL VAPOUR DEPOSITION," which in turn claims priority from a Swedish Patent Application having serial number 1950124-6, filed Feb. 1, 2019, titled "A METHOD AND APPARATUS FOR CHEMICAL VAPOUR DEPOSITION," both of which are incorporated herein by reference in their entireties.

TECHNICAL FIELD

The present disclosure relates to chemical vapour deposition

BACKGROUND ART

Techniques for depositing thin films of material on surfaces are used to form everything from the reflective layer of household mirrors to semiconductor devices such as processors. The desired thin films are often conducting or semi-conducting. Chemical vapour deposition (CVD) is a technique for making thin films from gaseous molecules, the molecules bearing the atoms used to form the thin films are called precursors. CVD is vital to the electronics industry but has a limitation when it comes to thin films of pure metals. The metal atoms in the precursor molecules are typically in a positive oxidation state, i.e. they lack electrons. Thus, the metal atoms are formally positive ions. For CVD of metals, a molecular reducing agent is needed to provide the electrons missing to deposit the metal film. However, many metals are very hard to reduce as they have a high reduction potential. Therefore, powerful reducing agents are needed. While some molecules with high enough reducing power has been demonstrated, they are complicated to synthesize chemically and difficult to use in CVD.

SUMMARY OF THE INVENTION

In accordance with the above, a need exists for improved deposition methods utilizing species comprising atoms with high reduction potential.

One object of the invention is to improve chemical vapour deposition of conductive and semi-conductive materials.

This has in accordance with the present disclosure been achieved by means of a method for chemical vapour deposition on a substrate, comprising a precursor step and a reactant step.

At least part of the substrate surface is electronically connected to a voltage source. The precursor step comprises chemisorbing a layer of precursor molecules on the substrate. The reactant step comprises adding to at least part of the substrate surface species able to reduce the precursor molecules. The method is characterized by applying a positive bias to at least part of the substrate surface by the voltage source during at least part of the reactant step, wherein the step of adding the reducing species comprises transmitting to at least part of the substrate surface free electrons provided by an electron source connected to the ground, whereby during the reactant step a closed electrical circuit is formed as the free electrons are transmitted to the substrate surface. The term free electrons herein refer to electrons as free particles. The term substrate surface herein refers to the outermost layer of the substrate and any deposited material. The term closed circuit herein refers to the ability to continuously substantially maintain a current through the substrate with a constant applied potential bias.

The positive bias attracts electrons towards the substrate surface regions electrically connected to the voltage source. The so obtained closed circuit prevents a negative charge build-up on the regions of the substrate surface electronically connected to the voltage source. The positive bias attracts electrons to electronically connected regions of the substrate surface wherein the electrons may reduce the precursor molecule.

The use of free electrons for reducing the precursor molecules removes the need to transport powerful reducing agents to the surface. The use of free electrons for reducing the precursor molecules may remove the need to change environmental conditions during deposition. The use of free electrons for reducing the precursor molecules primarily at connected regions of the surface may allow for new and/or improved techniques to create semiconductor devices.

The electron source may be a plasma generator. Plasma generators are commonly used in vacuum chambers designed for chemical vapour deposition to provide precursors. The prevalence of plasma generators in CVD setups allows the present disclosure to be utilized with minimal modifications in existing chemical vapour deposition systems.

The method is suitable to be used with any precursor able to be chemisorbed on an electrically conductive substrate and subsequently deposit at least part of the precursor on the substrate once reduced. The precursor may be metallocene molecules such as ferrocene, cobaltocene, nickelocene or ruthenocene.

In order to efficiently continue building layers of film the surface of the deposited material and the voltage source needs to stay electrically connected, therefore the deposited material needs to be a conductor or a semiconductor. Metallocenes is a group of molecules comprising metal atoms in a positive oxidation state, such as ferrocene, cobaltocene, nickelocene or ruthenocene. Reduction of at least some metallocenes at a conductive surface results in a deposition of the metal atom on the surface. At least some metallocenes are suitable for the use as precursor molecules in the present disclosure.

In order to reduce multiple layers of precursor molecules on the substrate surface, the method may either carry out the precursor step and the reactant step simultaneously or cycle the precursor step and reactant step. However, in order for electrons to be attracted to a region of the substrate surface, said surface region needs to be electrically connected to the voltage source. Thus, if the reduced precursor results in an insulating layer the reduction of precursor molecules will eventually stop. In order for the method to continuously build layers the precursor molecule comprises a reducible atom, wherein a solid material of the reduced atom is at least semi-conductive. As an example, the precursor ferrocene may be reduced so the iron atom in the precursor forms a conductive iron film on the substrate. The requirement of an electrical connection between substrate surface and voltage source for an efficient deposition may be utilized to control the location of layer growth, e.g., by using substrates patterned with an insulator material created with a technique such as lithography. The present disclosure may allow for a new and improved way to produce parts of integrated circuits, such as the fins in Fin field-effect transistors (Fin-FET).

The present disclosure relates to an apparatus for chemical vapour deposition on a substrate. The apparatus comprises a substrate holder, a substrate, a voltage source and an electron source. The substrate holder is arranged to hold the substrate. At least part of the substrate surface comprises chemisorbed precursor molecules. At least part of the substrate surface is electrically connected to the voltage source. The negative terminal of the voltage source may be connected to ground. The electron source may be connected to ground. The electron source is arranged to provide free electrons in the vicinity of the substrate. The apparatus is characterized by that a positive bias is applied to at least part of the substrate surface by the voltage source during operation. During operation both the electron source and positive substrate bias is active and free electrons are transported to the substrate. The apparatus is arranged to create a closed circuit as free electrons travel to the substrate.

The apparatus may comprise a vacuum deposition chamber. The substrate holder and substrate are located inside the vacuum deposition chamber. The voltage source and electron source may be interfaced with the vacuum deposition chamber. The vacuum deposition chamber allows deposition to take place at a low pressure and in a controlled environment.

The apparatus may comprise a sublimation chamber comprising a heater. The heater is arranged to hold and heat the precursor material. The sublimation chamber functions as a precursor vaporizer and provides precursor molecules in the gas phase.

DETAILED DESCRIPTION

Figure 1:
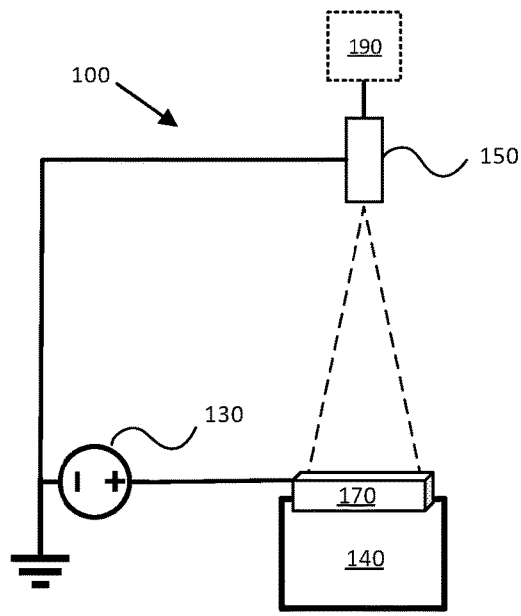
FIG. 1 shows schematically an apparatus for CVD

Throughout the figures, same reference numerals refer to same parts, concepts, and/or elements. Consequently, what will be said regarding a reference numeral in one figure applies equally well to the same reference numeral in other figures unless not explicitly stated otherwise.

FIG. 1 shows schematically an apparatus 100 for CVD, comprising a voltage source 130, a substrate holder 140 and an electron source 150. The substrate holder 140 is arranged to hold a substrate 170. At least part of the substrate 170 surface is electrically conductive or semi-conductive. At least part of the substrate surface 170 is when the substrate 170 is mounted in the substrate holder 140 electrically connected to the voltage source 130. The electron source 150 is grounded. The electron source 150 may be controlled by a grounded power source 190. The voltage source 130 and the substrate 170 may be electrically connected via at least one part of the substrate holder 140 arranged to form an electrical connection to the substrate 170.

The electron source 150 is arranged to provide free electrons in the vicinity of the substrate 170. The electron source 150 is for example a plasma generator, an electron flood gun, a field-emission source or a thermionic source. The term free electron herein refers to electrons as free particles. At least part of the substrate 170 surface is covered by chemisorbed precursor molecules. The precursor molecules on the substrate 170 surface comprise molecules able to be reduced by free electrons, such as ferrocene, whereby at least part of said precursor molecules are deposited on the substrate 170 surface.

In order for sufficient amounts of the free electrons provided by the electron source 150 to reach the substrate 170 surface the voltage source 130 is arranged to apply a positive potential relative to ground to at least part of the substrate surface 170. In the regions of the substrate 170 surface electronically connected to the voltage source 130, the applied potential reduces charge build-up and attracts free electrons. During operation a closed circuit is formed as a current run through the substrate 170. During operation the number of precursor molecules on the substrate 170 surface able to be reduced may be depleted, should no new precursor molecules be added to the surface 170, whereby the deposition ends.

The apparatus 100 may comprise a precursor providing arrangement able to continuously chemisorb precursor to the substrate 170 surface during operation. The apparatus 100 may comprise a precursor providing arrangement arranged to perform a step of chemisorbing precursor molecules to the substrate 170 surface before operating the apparatus 100 to perform a step of transporting electrons to the substrate 170 surface, thus depositing multiple layers by cycling between the steps.

Figure 2:
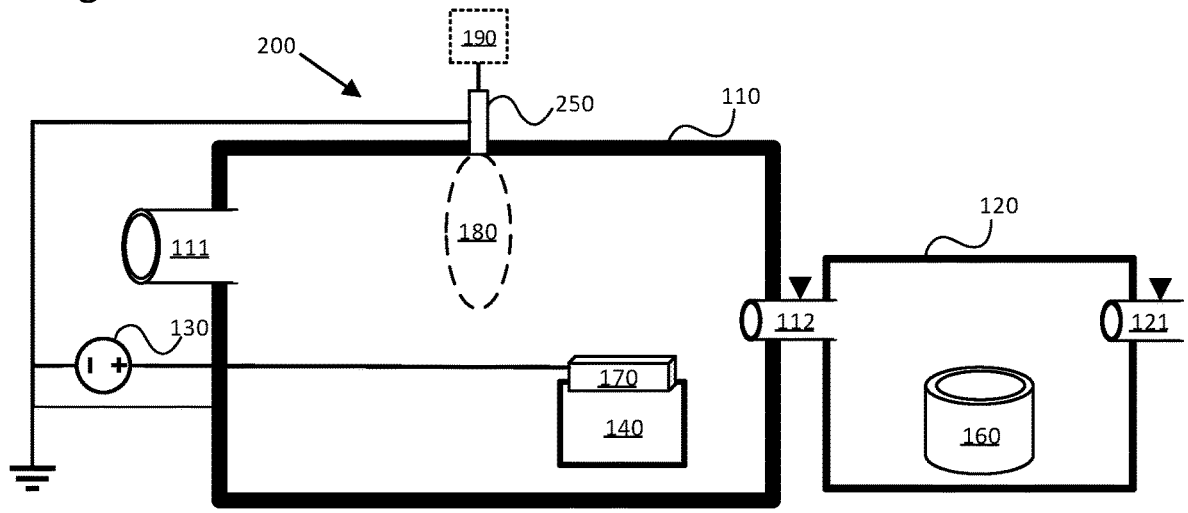
FIG. 2 shows schematically an apparatus for CVD in a vacuum chamber
FIG. 3A

FIG. 2 shows an apparatus 200 for CVD in a vacuum chamber.

In the illustrated example the apparatus comprises a vacuum deposition chamber 110, a sublimation chamber 120 and a voltage source 130. The vacuum deposition chamber 110 is grounded. The vacuum deposition chamber 110 is configured to connect to a pump. The vacuum deposition chamber 110 comprises a substrate holder 140, a plasma generator 250, a connection 111 to the pump and a connection 112 to the sublimation chamber 120. The sublimation chamber 120 comprises a heater 160 and a connection 121 to a gas line. The plasma generator 250 functions as an electron source 150. The connection 112 between the chambers and the connection 121 between the sublimation chamber 120 and the gas line each comprise a valve arranged to close the respective connection. The heater 160 is arranged to hold and heat the precursor material. The substrate holder 140 is arranged to hold a substrate 170 with at least parts of the substrate 170 surface electrically connectable to the voltage source 130. The voltage source 130 is arranged to apply a positive potential relative to ground to the at least parts of the substrate 170 surface electrically connected to the voltage source 130. The plasma generator 250 is connected to ground. The plasma generator 250 is arranged to provide a plasma in a plasma generation region 180. The plasma generator 250 may be controlled by a grounded power source 190. The substrate 140 holder is substantially positioned between the plasma generation region 180 and the connection 112 between chambers. The plasma generation region 180 is substantially located between the connection 111 leading to the pump and the substrate holder 140. The distance between the plasma generation region 180 and the substrate holder 140 may be in the order of a few centimetres.

Figure 3A:
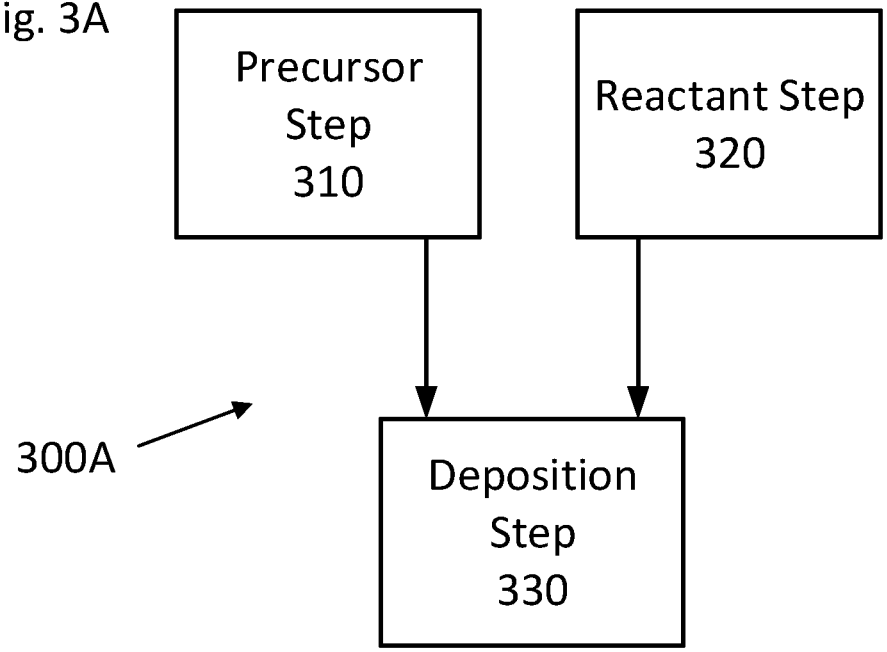
FIG. 3B depicts schematically two CVD method modes
Figure 3B:
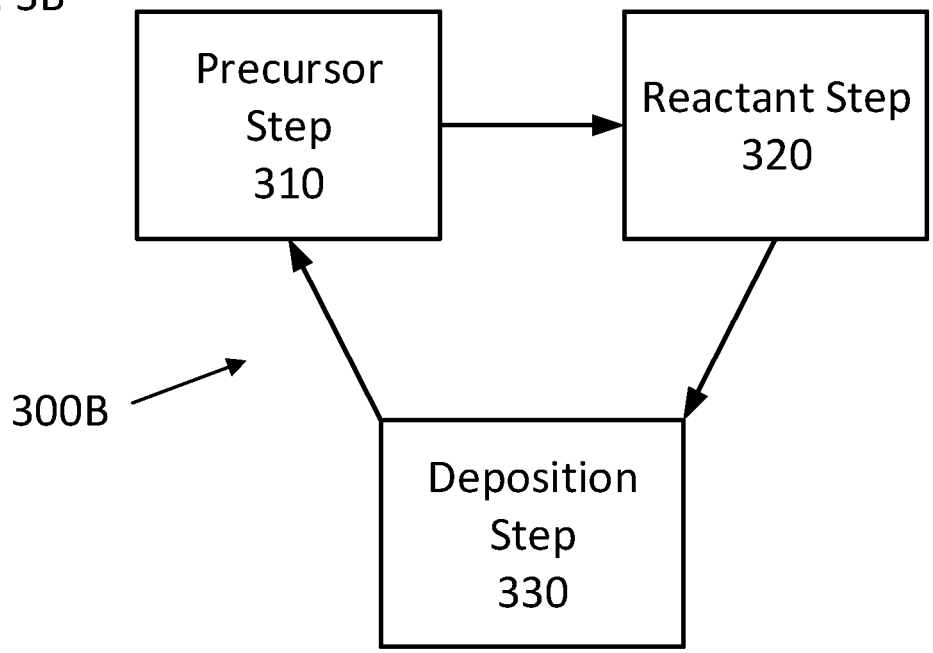

FIG. 3A and FIG. 3B depicts schematically two CVD method 300A-B example modes comprising a precursor step 310, a reactant step 320 and a deposition step 330. Wherein the precursor step 310 comprises chemisorbing precursor molecules on the substrate 170 surface. Wherein the reactant step 320 comprises transporting free electrons to at least part of the substrate 170 surface. The deposition step 330 comprises the electrons reducing the precursor molecules at the substrate 170 surface, thereafter at least a part of the reduced precursor molecule is deposited on the substrate 170 surface. Unlike the user-controlled precursor step 310 and reactant step 320 the deposition step 330 describes a chemical reaction at the substrate 170 surface and the resulting deposition. Since the deposition step 330 is causally dependent on the precursor step 310 and the reactant step 320 the present disclosure may be described without a deposition step 330. The deposition step 330 is included in order to clarify how the reactant step 320 doesn't necessarily cause material to be deposited on the substrate 170 surface.

FIG. 3A describes the method 300A example mode, wherein the precursor step 310 and reactant step 320 is initiated simultaneously, transporting precursor molecules and free electrons to the substrate 170 surface, running continuously and in parallel with the deposition step 330 until deposition stops by ending the precursor step 310 and/or reactant step 320.

FIG. 3B describes the method 300B example mode, wherein the precursor step 310 and reactant step 320 are cycled, in a manner similar to the self-limiting steps cycled in atomic layer deposition (ALD). The precursor steps 310 are carried out until a sufficient amount of precursor molecules is chemisorbed on the substrate 170 surface. The addition of precursor is stopped, e.g., by closing a valve to a sublimation chamber 130 comprising vaporized precursor material. The reactant steps 320 are carried out until a sufficient amount of precursor molecules has been reduced on the substrate 170 surface, at which point the electron source 150 is turned off and/or the bias voltage at the substrate surface 170 is changed. The number of free electrons reaching the substrate 170 surface can be calculated based on the current running through the voltage source 130. Under normal operation the deposition steps 330 substantially takes place at the same time as the reactant steps 320. However, the deposition step 330 does not occur during the reactant step 320 if no readily reducible precursor molecules exist on the substrate 170 surface.

Turning back to FIG. 2 an example of a CVD deposition procedure utilizing the present disclosure is described. The vacuum deposition chamber 110 is kept at room temperature. Initially the connection 112 between chambers is closed. To deposit iron, the precursor material, ferrocene, is loaded into the heater 160 located in the sublimation chamber 120. Cobaltocene, nickelocene or ruthenocene may be used to deposit cobalt, nickel and ruthenium respectively. A clean 10×10 mm substrate 170 comprising a 50 nm Ag film on Si is placed on the substrate holder 140. The substrate holder 140 and substrate 170 are positioned between the connector 112 to the sublimation chamber 120 and the plasma generation region 180. The substrate 170 is located a few centimetres away from the plasma generation region 180. The substrate 170 and the voltage source 130 are connected by electric leads, the electric leads interface with the substrate 170 Ag film at multiple points. The interfacing of leads with the substrate utilizes at least one part of the substrate holder 140 arranged to electrically connect to the substrate 170. The vacuum deposition chamber 110 is closed and pumped down. The connection 112 between chambers is opened, whereby both the chambers are pumped down to 50 Pa (0.4 Torr). The connection 121 between sublimation chamber 120 and the gas line is opened and the sublimation chamber 120 is purged with 40 sccm Ar gas, for two hours. The connection 121 to the gas line is closed and the chambers are pumped down to 50 Pa. The connection 112 between chambers is closed. The heater 160 heats the precursor to the precursor sublimation temperature, 70° C. for ferrocene. The voltage source applies +40 V DC between the substrate 170 and ground, whereby the substrate 170 surface has a positive bias. Simultaneously the plasma generator 250 starts creating an Ar plasma (70 W, 40 sccm) and the connection 112 between the chambers is opened. As the ferrocene precursor molecules reach the substrate 170 surface and are reduced by electrons Fe is deposited on the substrate 170 surface. A film is deposited on the substrate surface for 60 seconds with an average current of 300 mA through the substrate 170. Simultaneously the Ar plasma is turned off and the connection 112 between the chambers is closed. The vacuum deposition chamber 110 is filled with nitrogen (gas inlet not shown) and the deposition is completed.

The invention claimed:

1. A method for chemical vapour deposition on a substrate, the method comprising
a precursor step and a reactant step,
wherein the precursor step comprises chemisorbing a layer of precursor molecules on the substrate, and
wherein the reactant step comprises adding to at least part of the substrate surface a reducing species able to reduce the precursor molecule, wherein at least a part of the chemisorbed precursor molecules are reduced and a film is deposited on the substrate surface,
wherein a positive bias is applied to at least part of the substrate surface during at least part of the reactant step by a voltage source,
wherein the step of adding the reducing species comprises providing electrons as free particles by an electron source, and
wherein a closed electrical circuit is formed during the reactant step as the free electrons are transmitted to the substrate surface.

2. The method according to claim 1, wherein the precursor molecules comprise a reducible atom or molecule, wherein a solid material of the reduced atom or molecule is at least semi-conductive.

3. The method according to claim 1, wherein the precursor molecules comprise metallocene molecules such as ferrocene, cobaltocene, nickelocene or ruthenocene.

4. The method according to claim 1, wherein the precursor step and reactant step are cycled by alternating between the precursor step and the reactant step.

5. The method according to claim 1, wherein the substrate is initially patterned with a lithography and/or etching technique.

6. The method according to claim 1, wherein the substrate comprises a conductive substrate masked with an insulating material, leaving areas of exposed conductive substrate, whereby deposition of material only occurs on the exposed conductive substrate allowing a pattern of material to grow up from the exposed conductive substrate areas.

7. A FET comprising a fin, wherein at least the fin of the FET is manufactured according to the method of claim 6.

8. An apparatus for chemical vapour deposition on a substrate, the apparatus comprising,
a substrate holder for holding the substrate, wherein precursor molecules are arranged to be deposited on the substrate,
a voltage source,
a precursor molecule reducing species source arranged to provide reducing species able to reduce the precursor molecules at the substrate surface, wherein the precursor molecule reducing species source comprises an electron source, said electron being arranged to provide free electrons in the vicinity of the substrate, wherein the voltage source is arranged to apply a positive bias to at least part of the substrate surface, and wherein the free electrons when transmitted to the substrate surface form a closed electrical circuit.

9. The apparatus according to claim 8, wherein the electron source comprises a plasma generator.

10. The apparatus according to claim 8, comprising a precursor vaporizer arranged to provide precursor molecules in the gas phase.

11. The apparatus according to claim 8, comprising a vacuum chamber arranged to house the substrate holder and substrate in a controlled low-pressure environment.

\* \* \* \* \*